US008742535B2

(12) United States Patent
Bachman et al.

(10) Patent No.: US 8,742,535 B2
(45) Date of Patent: Jun. 3, 2014

(54) INTEGRATION OF SHALLOW TRENCH ISOLATION AND THROUGH-SUBSTRATE VIAS INTO INTEGRATED CIRCUIT DESIGNS

(75) Inventors: Mark A. Bachman, Sinking Springs, PA (US); Sailesh M. Merchant, Macungie, PA (US); John Osenbach, Kutztown, PA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/969,852

(22) Filed: Dec. 16, 2010

(65) Prior Publication Data
US 2012/0153430 A1 Jun. 21, 2012

(51) Int. Cl.
*H01L 23/52* (2006.01)
*H01L 21/76* (2006.01)
*H01L 21/44* (2006.01)

(52) U.S. Cl.
USPC ............ 257/508; 438/653; 438/667; 438/424

(58) Field of Classification Search
CPC .......... H01L 23/52; H01L 21/76; H01L 21/44
See application file for complete search history.

(56) References Cited

U.S. PATENT DOCUMENTS

| 7,276,787 | B2 | 10/2007 | Edelstein et al. | |
| 7,645,678 | B2 * | 1/2010 | Wu | 438/424 |
| 7,859,114 | B2 * | 12/2010 | Lindgren et al. | 257/774 |
| 2008/0079112 | A1 | 4/2008 | Uchiyama | |
| 2008/0124845 | A1 | 5/2008 | Yu et al. | |
| 2008/0318361 | A1 | 12/2008 | Han et al. | |
| 2009/0001598 | A1 | 1/2009 | Chiou et al. | |
| 2009/0001602 | A1 | 1/2009 | Chung | |
| 2009/0039471 | A1 | 2/2009 | Katagiri | |
| 2010/0090219 | A1 | 4/2010 | Jung | |
| 2010/0102453 | A1 * | 4/2010 | Tseng et al. | 257/774 |
| 2010/0224965 | A1 | 9/2010 | Kuo | |
| 2012/0091593 | A1 * | 4/2012 | Cheng et al. | 257/774 |

OTHER PUBLICATIONS

U.S. Appl. No. 12/969,836 entitled "Method of Fabrication of Through-Substrate Vias" filed Dec. 16, 2010 to Mark A. Bachman.

* cited by examiner

*Primary Examiner* — Walter H Swanson

(57) ABSTRACT

A method of manufacturing an IC, comprising providing a substrate having a first side and a second opposite side, forming a STI opening in the first side of the substrate and forming a partial TSV opening in the first side of the substrate and extending the partial TSV opening. The extended partial TSV opening is deeper into the substrate than the STI opening. The method also comprises filling the STI opening with a first solid material and filling the extended partial TSV opening with a second solid material. Neither the STI opening, the partial TSV opening, nor the extended partial TSV opening penetrate an outer surface of the second side of the substrate. At least either: the STI opening and the partial TSV opening are formed simultaneously, or, the STI opening and the extended partial TSV opening are filled simultaneously.

Figure 1:
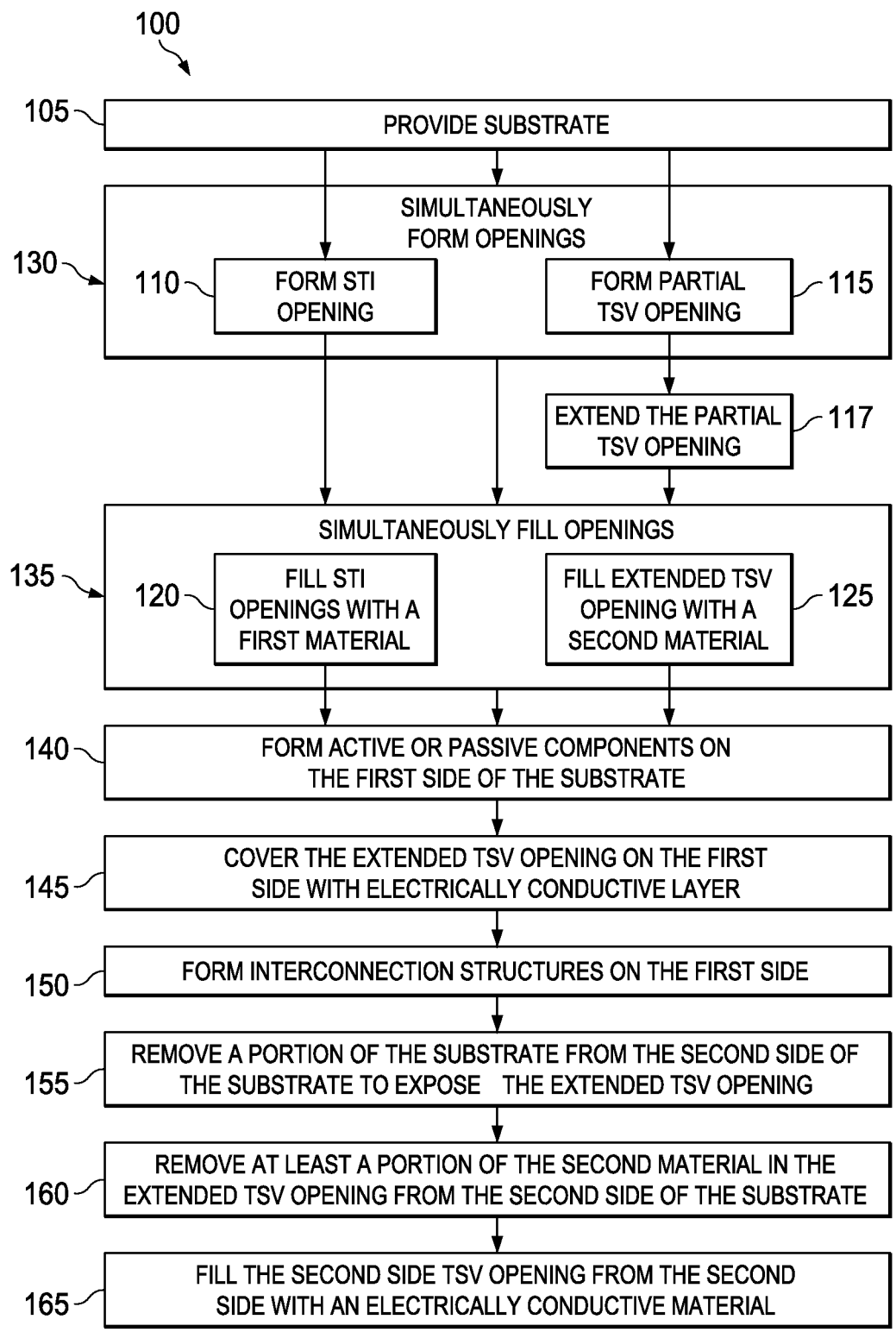

9 Claims, 9 Drawing Sheets

INTEGRATION OF SHALLOW TRENCH ISOLATION AND THROUGH-SUBSTRATE VIAS INTO INTEGRATED CIRCUIT DESIGNS

CROSS-REFERENCE TO RELATED APPLICATIONS

The present application is related to U.S. patent application Ser. No. 12/969,836 to M. A. Bachman, S. M. Merchant and J. Osenbach, entitled, METHOD OF FABRICATION OF THROUGH-SUBSTRATE VIAS ("Bachman et al."), and which is commonly assigned with the present application, which is incorporated herein by reference in its entirety.

TECHNICAL FIELD

This application is directed, in general to integrated circuits and their manufacture, and in particular, to integrated circuits that include shallow trench isolation and through-substrate via structures.

BACKGROUND

Typical semiconductor integrated circuit (IC) designs require that some circuit components be electrically isolated from other circuit components within the design to avoid deleterious electrical interactions such as shorting or crosstalk. One method of isolating circuit components uses shallow trench isolation (STI) to separate these regions. Also in some IC designs, such as three-dimensional IC designs, through-substrate vias (TSV) are created connecting frontside circuitry to the substrate's back-side.

SUMMARY

The present disclosure provides, in one embodiment, a method of manufacturing an integrated circuit. The method comprises providing a substrate having a first side and a second opposite side, forming a shallow trench isolation opening in the first side of the substrate and forming a partial through-substrate via opening in the first side of the substrate. The method also comprises extending the partial through-substrate-via opening, wherein the extended partial through-substrate-via opening is deeper into the substrate than the shallow trench isolation opening. The method further comprises filling the shallow trench isolation opening with a first solid material and filling the extended partial through-substrate via opening with a second solid material. Neither the shallow trench isolation opening, the partial through-substrate-via opening, nor the extended partial through-substrate-via opening penetrate an outer surface of the second side of the substrate. At least either: the shallow trench isolation opening and the partial through-substrate-via opening are formed simultaneously, or, the shallow trench isolation opening and the extended partial through-substrate-via opening are filled simultaneously.

Another embodiment is an integrated circuit. The integrated circuit comprises a substrate having a first side and a second opposite side. The integrated circuit also comprises a shallow trench isolation structure and through-substrate via. One end of the shallow trench isolation structure is buried inside the substrate and an opposite end of the shallow trench isolation structure is located at a surface of the first side of the substrate. One end of the through-substrate via is located at the surface of the first side of the substrate and an opposite end of the through-substrate via is located at a surface of the second side of the substrate. A same insulating layer is located within an opening defining the shallow trench isolation structure and within an opening defining the through-substrate via.

Still another embodiment of the disclosure is an integrated circuit comprising a substrate having a first side and a second opposite side, a shallow trench isolation structure and through-substrate via. One end of the shallow trench isolation structure is buried inside the substrate and an opposite end of the shallow trench isolation structure is located at a surface of the first side of the substrate. One end of the through-substrate via is located at the surface of the first side of the substrate and an opposite end of the through-substrate via is located at a surface of the second side of the substrate. The shallow trench isolation structure and the through-substrate via are formed by a process that includes: forming a shallow trench isolation opening in the first side of the substrate; forming a partial through-substrate via opening in the first side of the substrate; extending the partial through-substrate-via opening, wherein the extended partial through-substrate-via opening is deeper into the substrate than the shallow trench isolation opening; filling the shallow trench isolation opening with a first solid material; and filling the extended partial through-substrate via opening with a second solid material. Neither the shallow trench isolation opening, the partial through-substrate-via opening, nor the extended partial through-substrate via opening penetrates an outer surface of the second side of the substrate. At least either: the shallow trench isolation opening and the partial through-substrate-via opening are formed simultaneously, or, the shallow trench isolation opening and the extended partial through-substrate-via opening are filled simultaneously.

BRIEF DESCRIPTION

Figure 6:
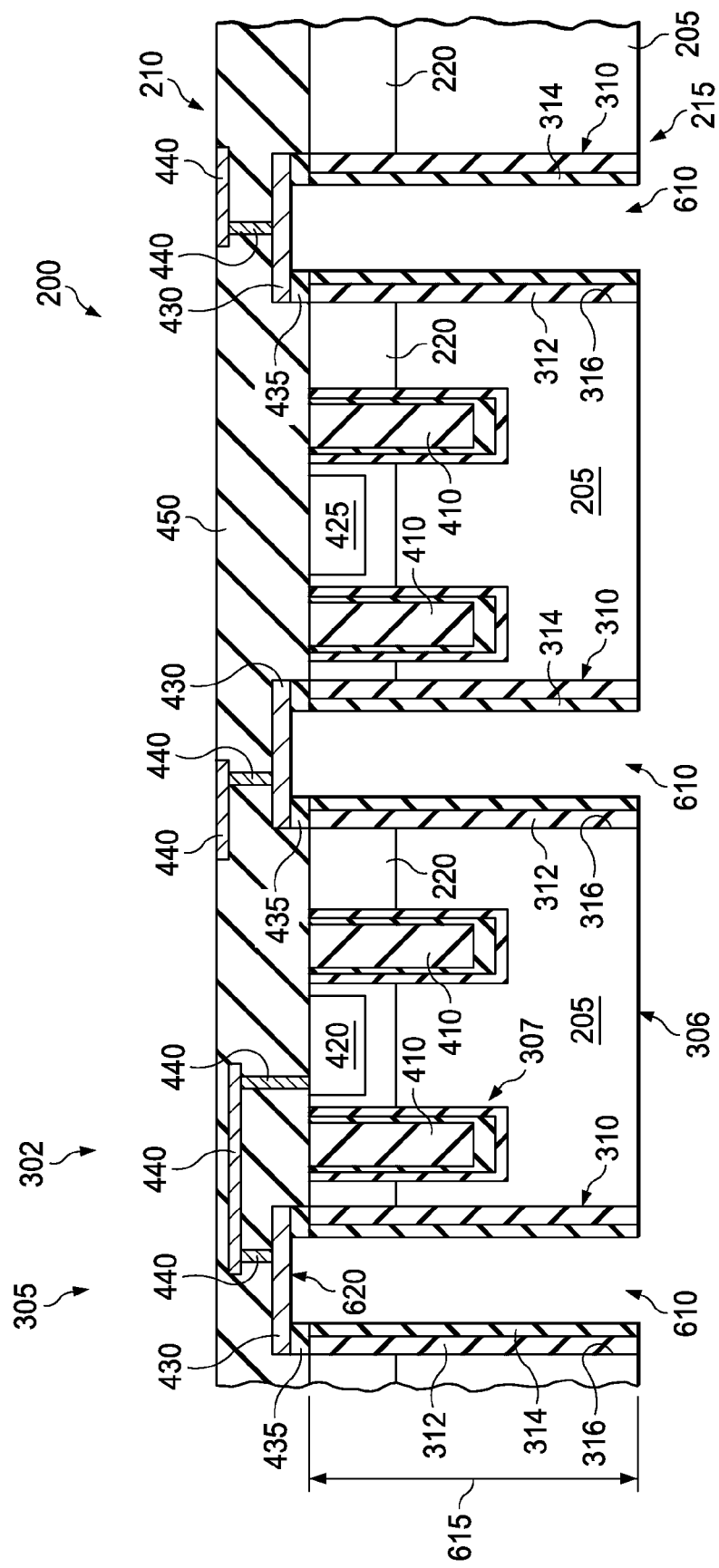
Figure 7:
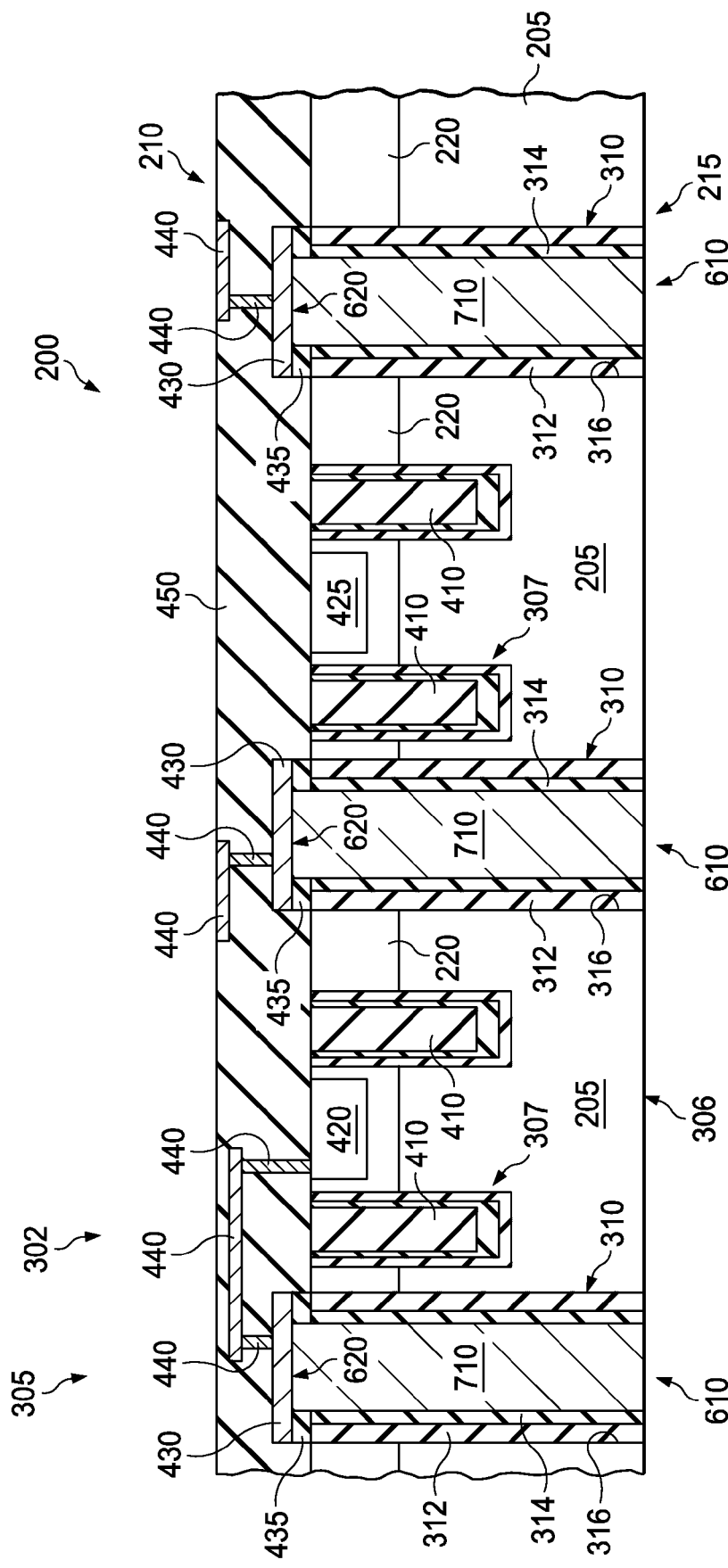
Figure 8:
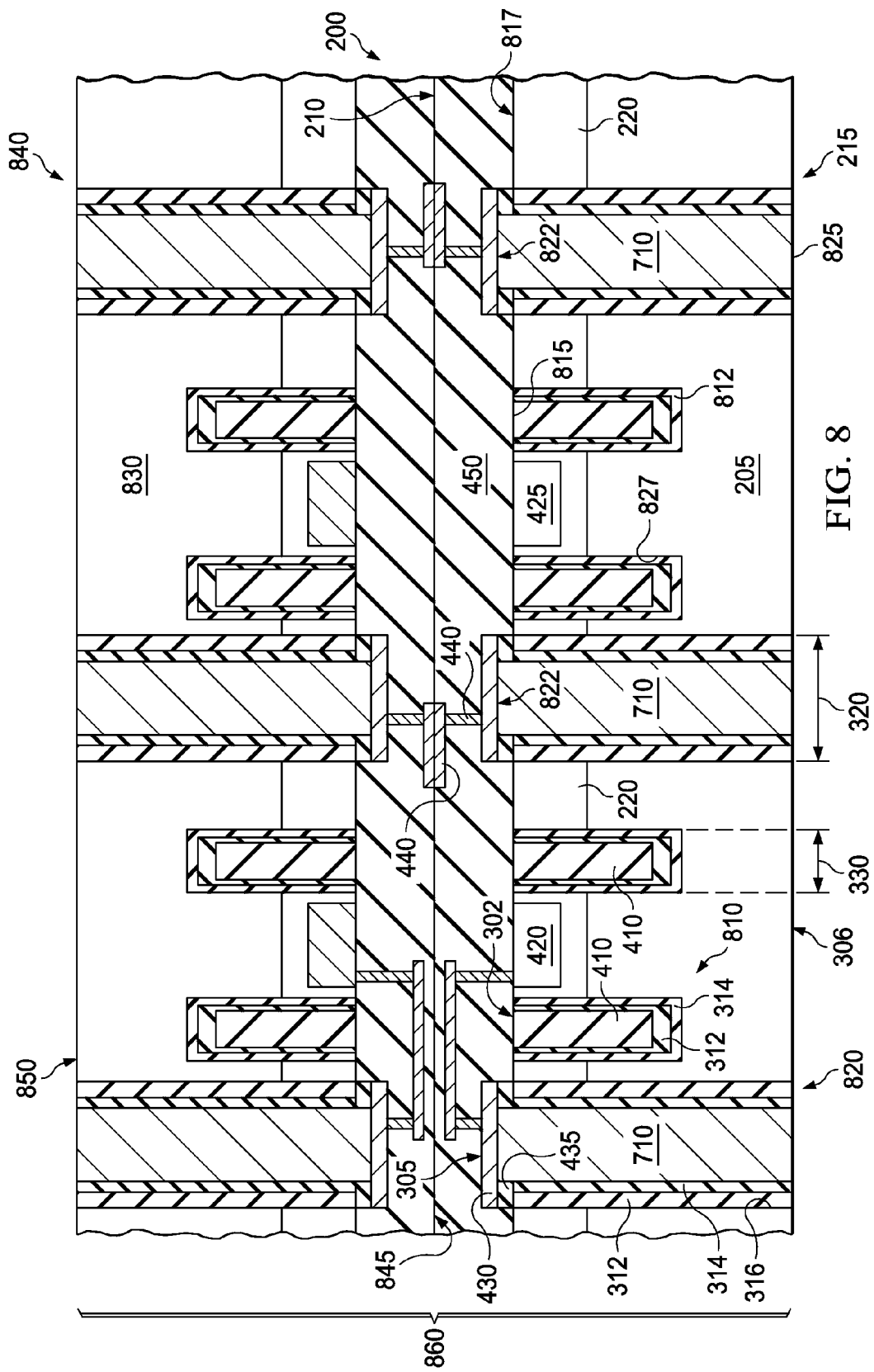

For a more complete understanding of the present invention, reference is now made to the following descriptions taken in conjunction with the accompanying drawings, in which:

FIG. 1 presents a flow diagram illustrating selective steps in an example embodiment of a method of manufacturing an integrated circuit of the disclosure;

FIGS. 2-7 presents cross-sectional views of selected steps in an example method of manufacturing an example integrated circuit of the disclosure in accordance with the example method presented in FIG. 1; and FIG. 8 presents an example integrated circuit of the disclosure.

DETAILED DESCRIPTION

For the purposes of the present disclosure, the term, "or," as used herein, refers to a non-exclusive or, unless otherwise indicated.

Embodiments of the present disclosure improve the efficiency of IC designs. At least one of forming the STI opening and forming a portion of the TSV opening, or, filling STI and TSV openings, are performed simultaneously as a single step. The simultaneous processing of one or both of these steps in the IC's fabrication can permit one or more of common patterning, etching, deposition or other formation processes prior to dielectric and metal stack processing. This, in turn, can reduce the cost, the time and resource utilization, by reducing the number of separate processing steps or tools needed for the IC's fabrication, as compared to traditional methods.

One embodiment of the disclosure is a method of manufacturing an IC. FIG. 1 presents a flow diagram illustrating selective steps in an example embodiment of a method 100 of manufacture. FIGS. 2-8 present cross-sectional views of selected steps in an example method of manufacturing an example integrated circuit 200 of the disclosure, in accordance with the example method 100 presented in FIG. 1.

Figure 2:
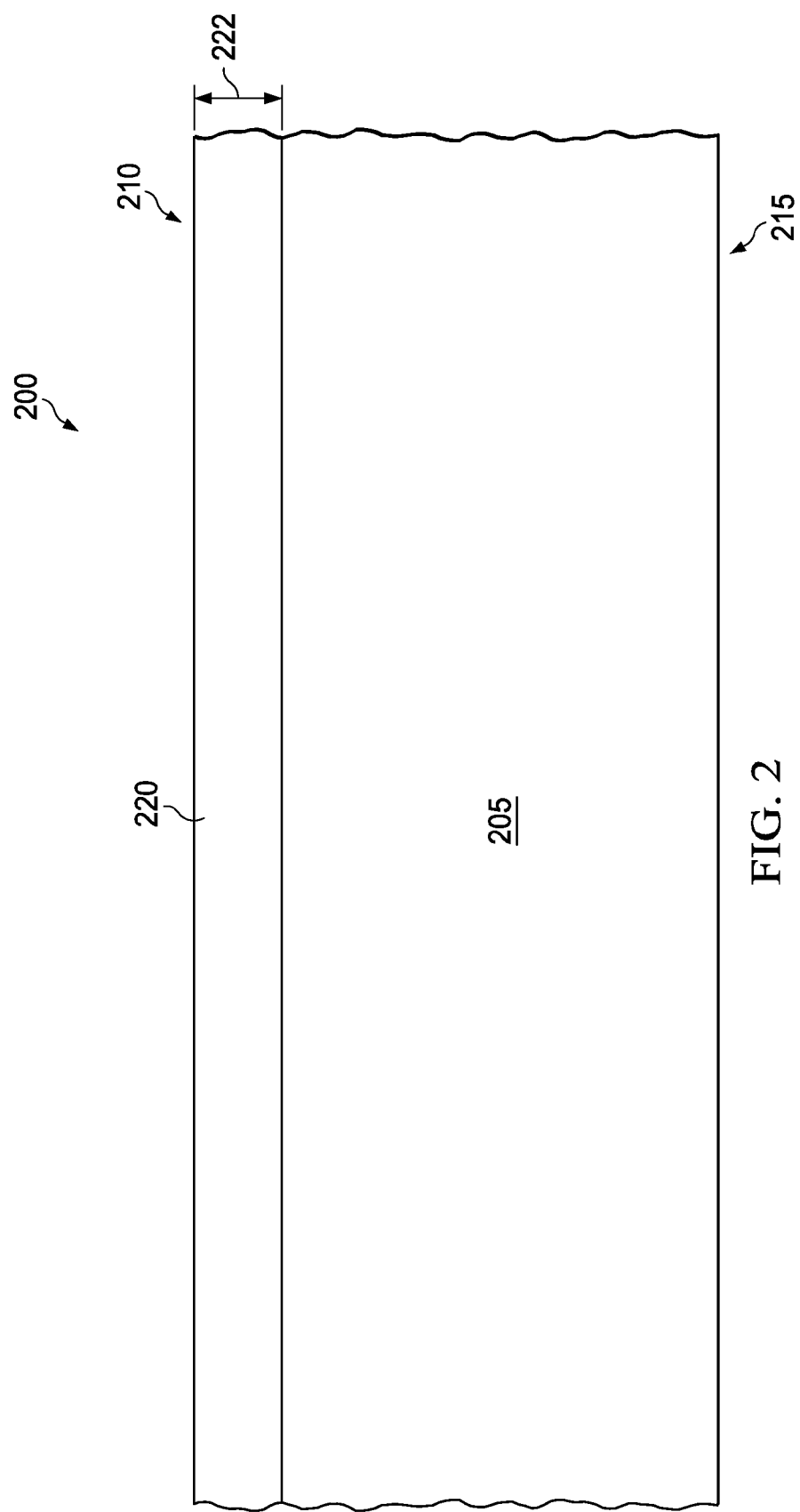

With continuing reference to FIG. 1 throughout, as shown FIG. 2, the method 100 includes a step 105 of providing a substrate 205 having a first side 210 and a second opposite side 215. Example embodiments of the substrate 205 include a wafer substrate composed of silicon or other semiconductor materials, substrate dies, package substrates, or interposer substrates. Some embodiments of the substrate 205 can have multiple layers to facilitate the efficient fabrication of various IC components. For instance, some embodiments of the substrate 205 include a constituent layer 220. For example, some embodiments of the constituent layer 220 can include a mono-crystalline layer composed of silicon such as epitaxial-formed crystalline silicon. In other embodiments, the constituent layer 220 can include a silicon-on-insulator layer, or polysilicon layer or other material layers well known to those skilled in the art. In some cases, the constituent layer 220 can have a thickness 222 in a range from 10 to 20 microns. One of ordinary skill would appreciate that other types of substrates and constituent layers could be used, if desired.

Figure 3A:
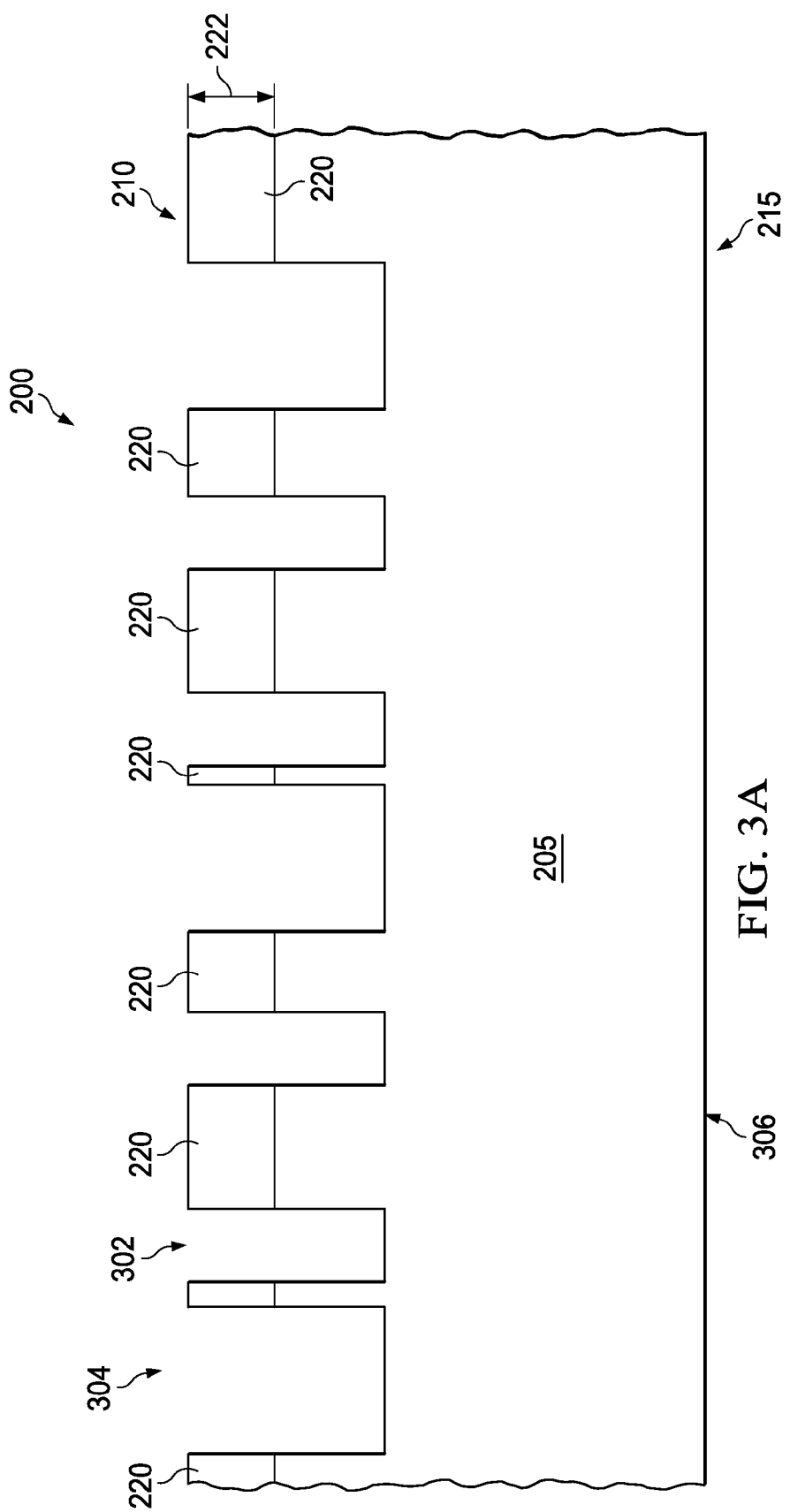

As shown in FIG. 3A, the method 100 includes a step 110 of forming a STI opening 302 in the first side 210 of the substrate 205, and, a step 115 of forming a partial TSV opening 304 in the first side 210 of the substrate 205. One of ordinary skill in the art would be familiar with the procedures to pattern (e.g., by conventional photolithography and masking processes) and to etch (e.g., reactive ion etching or other conventional etching processes) the first side 210 of the substrate 205 to form the openings 302, 304 in accordance with steps 110, 115.

Figure 3B:
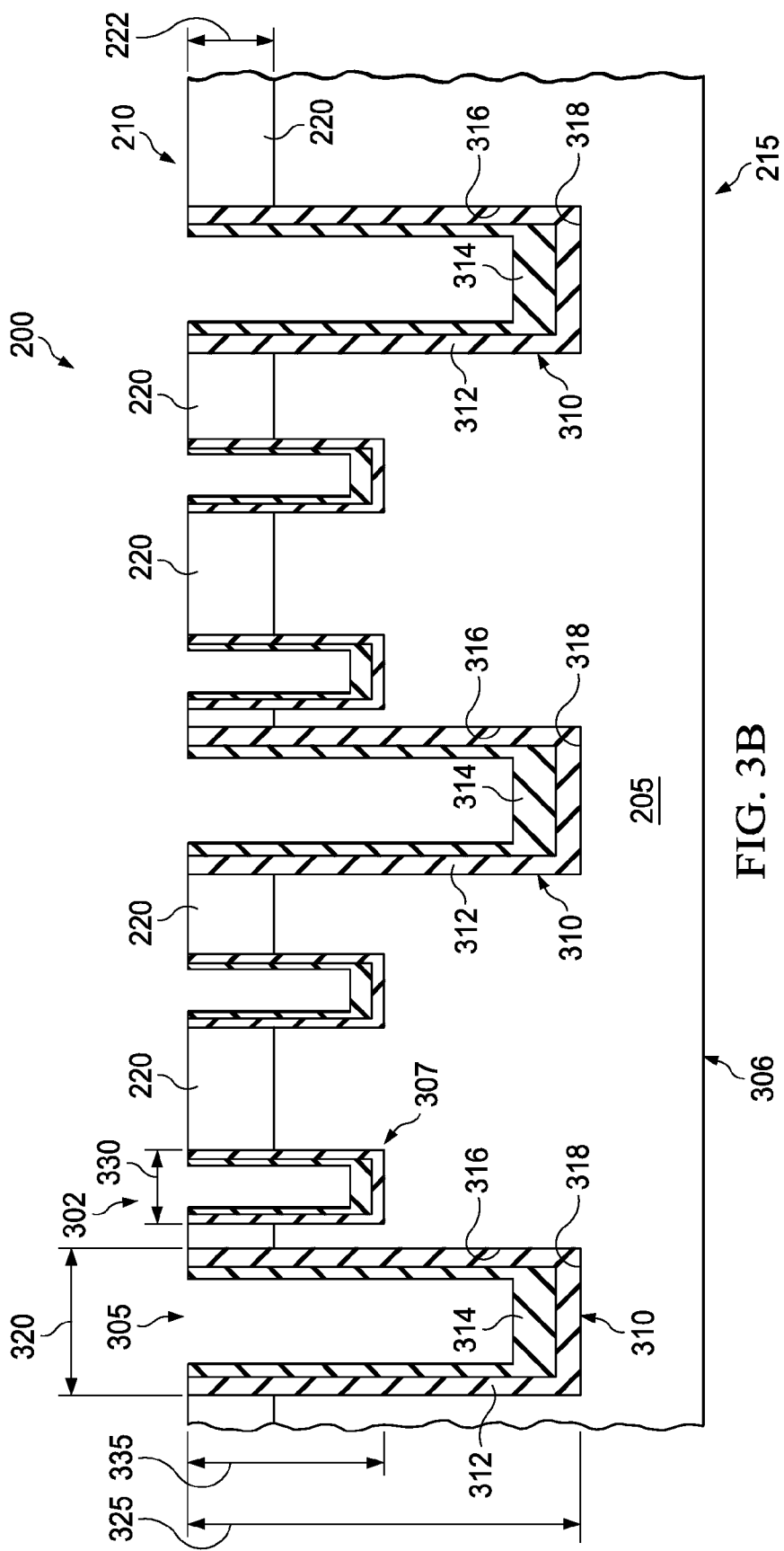

As shown in FIG. 3B, the method 100 includes a step 117 of extending the partial TSV opening 304 (FIG. 3A), wherein the extended partial TSV opening 305 is deeper into the substrate 205 than the STI opening 302. One of ordinary skill in the art would be familiar with the procedures to additionally pattern and to etch the first side 210 of the substrate 205 to form the extended partial TSV opening 305.

As also illustrated in FIGS. 3A-3B, neither the STI opening 302, the partial TSV opening 304, nor the extended partial TSV opening 305 penetrate an outer surface 306 of the second side 215 of the substrate 205. One of ordinary skill in the art would be familiar with the procedures to achieve such a configuration of the openings 302, 304, 305 at different steps in the method 100.

The method 100 includes a step 120 of filling the STI opening 302 with a first solid material 307, and step 125 of filling the extended partial TSV opening 305 with a second solid material 310.

At least either: 1) the STI opening 302 and the partial TSV opening 304 are formed simultaneously (i.e., steps 110, 115 are performed simultaneously as a single step 130), or, 2) the STI opening 302 and the extended partial TSV opening 305 are filled simultaneously (i.e., step 120, 125 are performed simultaneously as a single step 135).

There are gains in time, cost or resource efficiencies by either, or both, simultaneously forming the openings 302, 304 (step 130) or simultaneously filling the openings 302, 305 (step 135). For instance, it is sometimes beneficial to use the same etching tool and same etching process to simultaneously form the two different openings 302, 304. Similarly, it is sometimes beneficial to use the same deposition tool or other formation tool and the same deposition process or other formation process to simultaneously fill the two different types of openings 302, 305 with a same solid material.

In some cases, however, it can be desirable to use different processes to form the openings 302, 304, or, to fill the openings 302, 305 using different processes or to fill using different solid materials.

For instance, in some embodiments, after simultaneously forming the STI opening 302 and the partial TSV opening 304 (step 130) the STI opening 302 is filled from the first side 210 of the substrate 205 with a first solid material 307 that includes a insulating material, and, the extended partial TSV opening 305 is filled from the first side 210 of the substrate 205 with a second solid material 310 that includes a different insulating material or an electrically conductive material.

In other embodiments, however, the STI opening 302 and the partial TSV opening 304 are simultaneously formed in step 130, and then, the STI opening 302 and the extended partial TSV opening 305 are simultaneously filled in step 135. In such cases, the first solid material 307 and the second solid material 310 can include a similar material or identical material.

In still other embodiments it is desirable to use two different processes (e.g., step 110 and step 115), to form the STI opening 302 and partial TSV opening 304, e.g., such that the opening 302 have a different aspect ratio as compared to the partial TSV opening 304 or the extended partial TSV opening 305. For instance, the width 320 to depth 325 ratio of the extended partial TSV opening 305 can be different (e.g., at least about 10 percent or more different in some embodiments) than the width 330 to depth 335 ratio of the STI opening 302. One skilled in the art would recognize that using different processes to form the openings 302, 304, 305 does not preclude using a single same step 135 to fill the openings 302, 305, however.

As noted above, in some cases it is desirable to use two different processes (e.g., steps 120, 125) to fill the STI opening 302 and the extended partial TSV opening 305 with different solid materials 307, 310, respectively. For example, in some embodiments, the step 120 to fill the STI opening 302 can include a physical vapor deposition process or chemical vapor deposition process or other processes to fill the STI opening 302 with one or more type of insulating material 307 (e.g., multiple layers of different insulating materials, in some cases). In some embodiments, the step 125 to fill the extended partial TSV opening 305 can include a physical vapor deposition process (e.g., sputtering) and electrochemical deposition process or other forming processes to fill the opening 305 with a electrically conductive material 310. One skilled in the art would recognize that using different processes (steps 120, 125) to fill the openings 302, 305 does not preclude using a same single step 130 to form the openings 302, 304, however.

FIG. 3B shows an embodiment of the method 100 when the STI opening 302 and the extended partial TSV opening 305 are simultaneously filled (step 135). In such cases of simultaneous filling the first and second solid materials 307, 310 are preferably insulating materials. In some cases, e.g., the step 120 of filling the STI opening 302 includes filling the opening 305 with an insulating material 310 that includes a passivation layer 312, and diffusion barrier layer 314. The step 125 of filling the extended partial TSV opening 305 can be the same as step 120 (i.e., simultaneous filling step 135). One or both of the layers 312, 314 can be on the interior walls (e.g., coating the entire sidewalls 316 and floor 318 in some cases) of the STI opening 302 or the extended partial TSV opening 305. In some cases, the step 125 of filling the extended partial TSV opening 305 also includes filling the opening 305 with an insulating material 310 that includes the diffusion barrier layer 314, e.g., that can coat the interior walls (e.g., the sidewalls 316 and floor 318) of the opening

305. In such cases, one again, the step 120 of filling the STI opening 302 can be the same as step 125 (i.e., a simultaneous step 135) and therefore the diffusion barrier layer 314, e.g., coats the interior walls of the STI opening 302.

Figure 4:
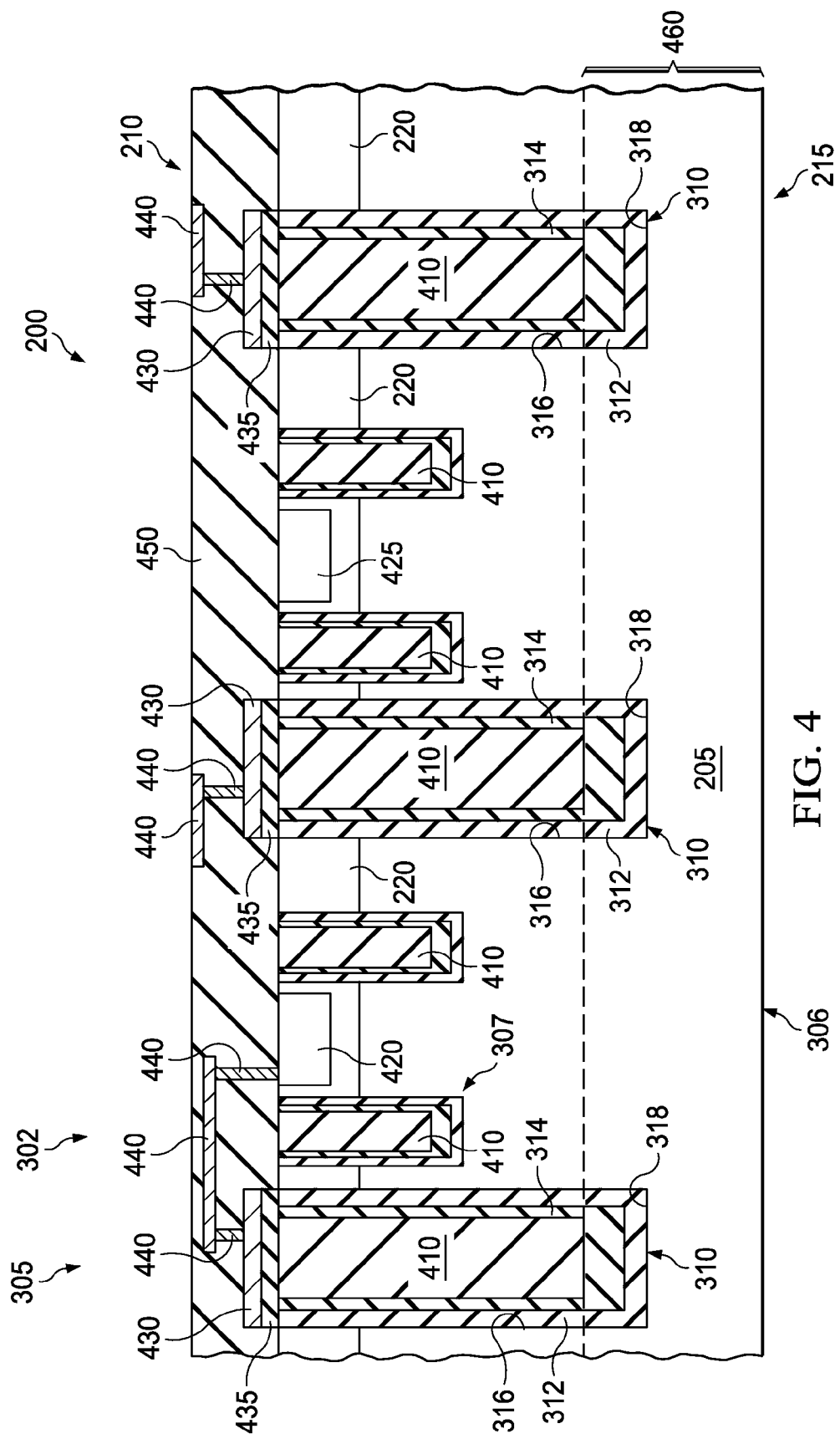

As further illustrated in FIG. 4, in some cases the step 125 of filling the extended partial TSV opening 305 can include filling the opening 305 with an insulating material 310 that includes an insulating plug 410. When the step 120 of filling STI opening 302 also includes filling the opening 302 with an insulating plug 410, then both the STI opening 302 and extended partial TSV opening 305 can be filled with a same insulating solid material (e.g., the first and second materials 307, 310 are the same).

As illustrated in FIG. 4, in some cases, the STI opening 302 and extended partial TSV opening 305 are both filled with an insulating material (e.g., the first and second solid materials 307, 310) that includes one or more of a passivation layer 312 of silicon oxide that coats the interior walls 316, 318 of the TSV opening and STI opening 302; a diffusion barrier layer 314 of silicon nitride on the passivation layer 312 and an insulating plug 410 of dielectric material (e.g., silica glass, in some cases), contacting the diffusion barrier layer and substantially filling the entire depths 335, 325 (FIG. 3), respectively, of the STI opening 302 and extended partial TSV opening 305.

Some embodiments of the method 100 can further include a step 140 of forming at least one active or passive electronic component 420 (FIG. 4) on the first side 210 of the substrate 205. One of ordinary skill in the art would be familiar with the procedures to fabricate passive components, such as resistors or inductors, or active components, such as memory circuit components (e.g., SRAM or DRAM memory) or logic circuit components (e.g., CMOS or bi-CMOS logic integrated circuits).

As further explained in Bachman et al., in some case, it is preferable to form the active or passive component 420 before filling the extended partial TSV opening 305 with an electrically conductive material if this avoids exposing the electrically conductive material in the opening 305 to subsequent high temperature processes (e.g., temperature of about 200° C. or higher in some embodiments).

In some embodiments, the active or passive electronic component 420 is electrically isolated from an adjacent active or passive electronic component 425 by at least one STI opening 302 being located between the two components 420, 425. In some embodiments, the active or passive electronic component 420 is electrically isolated from an adjacent extended partial TSV opening 305, by at least one STI opening 302 being located between the active or passive electronic component 420 and the adjacent TSV opening 305. Forming the adjacent active or passive electronic components 420, 425 so that they are separated from each other, or from an adjacent TSV, by a STI structure helps reduce cross-talk and other electrical interferences between these components.

Some embodiments of the method 100 can further include a step 145 of covering the extended partial TSV opening 305 on the first side with an electrically conductive layer 430. One of ordinary skill in the art would be familiar with the procedures to form the electrically conductive layer 430 on a substrate 205. As a non-limiting example, step 145 can include forming (e.g., sputtering) a seed layer of a metal (e.g., tungsten, gold or copper) which in some cases is followed by electrochemical formation of the same metal (e.g., copper). In some cases, as illustrated in FIG. 4, as part of forming the electrically conductive layer 430, a barrier layer 435 (e.g., a silicon nitride layer) is first formed and then patterned so as to cover the extended partial TSV opening 305. In some embodiments, the first-side extended partial TSV opening 305 is covered with the electrically conductive layer 430 in step 145 before the solid material 310 (e.g., an insulating material) in the opening 305 is removed, or, before the opening 305 is filled with an electrically conductive material. This ordering of steps may be advantageous, e.g., when step 145 includes exposing the substrate 205 to high temperature processes.

Some embodiments of the method 100 further include a step 150 of forming interconnect structures 440 (e.g., metal lines, vias, and landing pads) on the first side 210 of the substrate 205. One of ordinary skill in the art would be familiar with the procedures to form the interconnect structures 440. For instance, as part of step 150, one or more interlayer dielectric layers 450 can be formed on the first side 210 to support and electrically insulate the interconnect structures 440.

In some embodiments, at least one of the interconnect structures 440 contacts an electrically conductive layer 430 covering a first-side extended partial TSV opening 305, and, also contacts an active or passive component 420 on the substrate 205. That is, the interconnect structure 440 is configured to electrically couple the active or passive component 420 to the TSV structure through the electrically conductive layer 430. In other embodiments, however, the TSV or its covering electrically conductive layer 430 may not be coupled to any of the active or passive component 420 on the substrate 205 and may simply pass through the substrate 205.

In some embodiments the interconnect structures 440 are formed in step 150 before the material 310 (e.g., an insulating material) in the opening 305 is removed, or, before the opening 305 is filled with a conductive material. This ordering of steps, e.g., may be advantageous when step 150 includes exposing the substrate 205 to high temperature processes.

Figure 5:
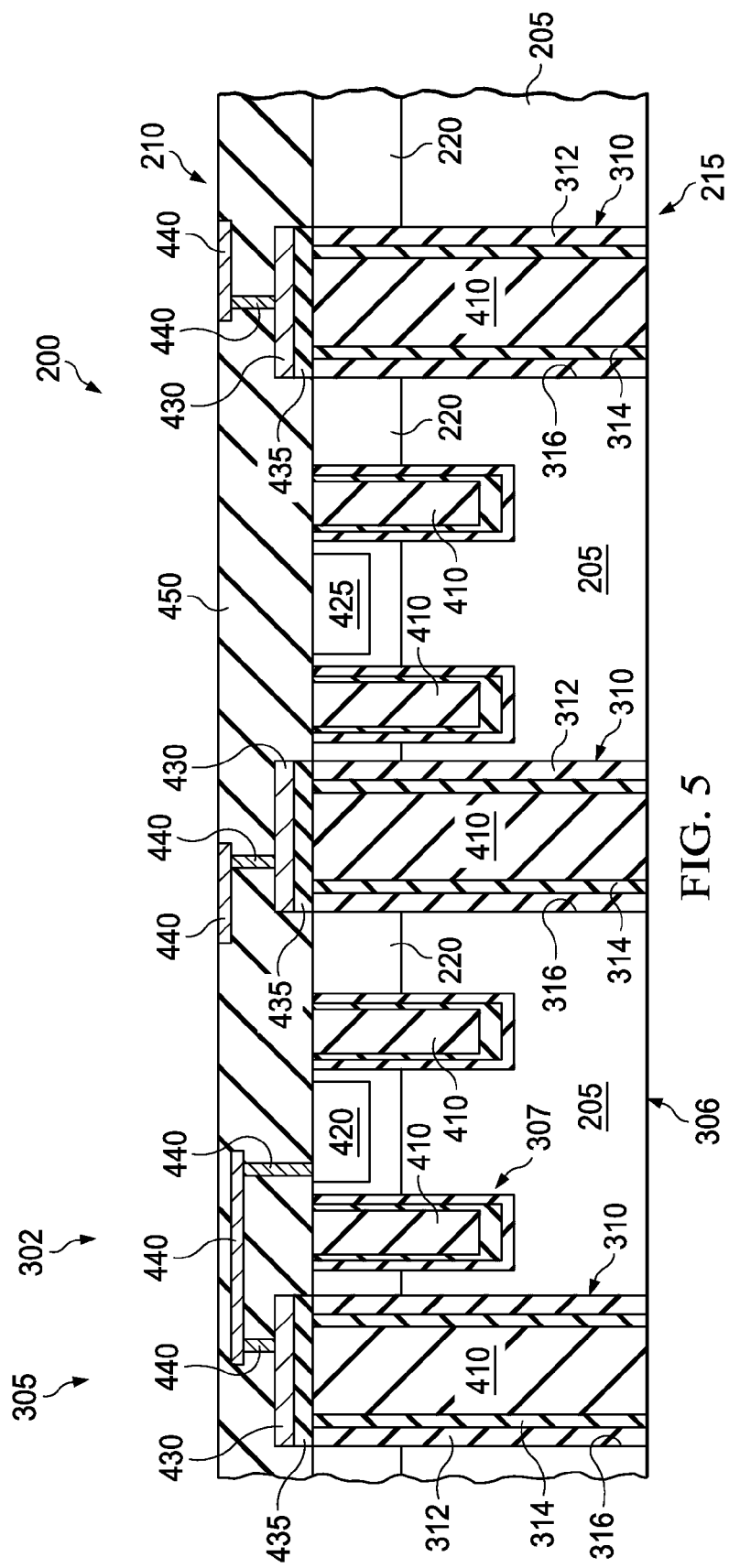

Some embodiments of the method 100 can also include a step 155 of removing a portion of the substrate (e.g., a substrate layer portion 460, FIG. 4) from the second side 215 of the substrate 205 such that the extended partial TSV opening 305 is exposed on the second side 215. For instance, FIG. 5 shows the IC 200 after performing chemical mechanical polishing (CMP) to planarize the substrate's second side surface 306 until the extended partial TSV opening 305 is exposed on the second side 215. One skilled in the art would appreciate, however, that other types of substrate removal procedures (e.g., wet and dry etching) could be used to expose the extended partial TSV opening 305.

As illustrated in FIG. 6, some embodiments of the method 100 further include a step 160 of removing at least a portion of the solid material 310 (e.g., the insulating plug 410, FIG. 5) inside of the extended partial TSV opening 305 from the second side 215 of the substrate 205 such that a second-side TSV opening 610 extends from the second side 215 to the first side 210 of the substrate 205.

In some cases, it is desirable to retain some of the material 310 inside of the second-side TSV opening 610. For instance, having a passivation layer 312 and barrier layer 314 on sidewalls 316 of the second-side TSV opening 610 can be advantageous when the second side through-via opening 610 is to be filled with an electrically conductive material composed of highly diffusible metal atoms (e.g., copper atoms). Such metal atoms can detrimentally diffuse from the TSV into the substrate 205, including those regions of the substrate 205 where the active and passive components 420 are located, thereby damaging these components 420.

In some cases, for example, removing at least a portion of the material 310 in step 160 can include a dry etch process of the insulating plug 410 (FIG. 5) that substantially traverses an entire thickness 615 of substrate 205 the second-side TSV opening 610. In some cases the removing step 160 can additionally or alternatively include a wet etch process (e.g., a hydrofluoric acid etch process) of the insulating plug 410 (e.g., a silica glass or other dielectric material) that substantially traverses the entire thickness 615 of substrate 205 through the second-side TSV opening 610. In some cases, removing at least a portion of the solid material 310 in step 160 can also include a plasma etch process configured to remove a barrier layer 435 (e.g., silicon nitride layer) from an electrically conductive layer 430 covering the extended partial TSV opening 305 on the first side 210. That is, removing a portion of the material 310 can include exposing an interior surface 620 of the electrically conductive layer 430 that covers the opening 305. One skilled in the art would be familiar with how to configure such wet etch and plasma etch processes so as to leave the passivation layer 312 and barrier layer 314 substantially intact on the sidewalls 316, if desired.

Some embodiments of the method 100 further include a step 165 of filling the second-side TVS opening 610 on the second side of the substrate 205 with an electrically conductive material 710 (FIG. 7). In some cases, when there is an electrically conductive layer 430 covering the opening 305 on the first side 210, the electrically conductive material 710 entirely fills the second-side TSV opening 610 so as to directly contact the electrically conductive layer 430 (e.g., contacting the interior surface 620 of the electrically conductive layer 430).

Non-limiting examples of the types of electrically conductive material 710 that could be used includes copper, tungsten, gold, polysilicon, conductive polymers, or similar materials familiar to those skilled in the art. In some embodiments, to fill a deep opening 610 (e.g., in some embodiments where the substrate thickness 615 (FIG. 6) is about 50 microns or greater) it can be advantageous for the filling step 165 to include sputter depositing or other processes for forming a metal seed layer (e.g., copper) on the interior side walls 615 of the second-side TSV opening 610 (including on any intervening insulating layers 312, 314 on the opening's sidewalls 316) and then electrodepositing or otherwise forming a bulk metal layer (e.g., copper) to fill the remainder of the opening 610. Other methods to fill the opening 610 in accordance with step 165 include spin-on processes or other processes familiar to one of ordinary skill in the art. One skilled in the art would also be familiar with further steps such as CMP to remove excess electrically conductive material 710 from the second side 215 surface 306, such that the material 710 is only present in the opening 610.

As noted above, in some cases, it is advantageous for the step 165 of filling the second-side TSV opening 610 with the electrically conductive material, to be performed after a number of steps (e.g., one or more of steps 140-160) have been completed. Based on the present disclosure and of Bachman et al., one of ordinary skill would appreciate that it could be advantageous to perform step 165 after other processing steps have been done, e.g., to avoid exposing certain conductive materials 710 (e.g., copper) located in the second-side TSV opening 610 to high temperature processes, and thereby avoid causing thermal expansion of the material 710, which in turn, can cause cracking or other damage to the substrate 205.

Another embodiment of the disclosure is an IC. FIG. 8 presents an example IC 200 of the disclosure. The IC 200 could include any of the features as described above in the context of FIGS. 1-7.

The example IC 200 depicted in FIG. 8 comprises a substrate 205 having a first side 210 and a second opposite side 215. The IC 200 also comprises a STI structure 810, wherein one end 812 of the STI structure is buried inside the substrate 205 and an opposite end 815 of the STI structure 810 is located at a surface 817 of the first side 210 of the substrate 205. The IC 200 further comprises a TSV 820, wherein one end 822 of the TSV 820 is located at the surface 817 of the first side 210 of the substrate 205 and an opposite end 825 of the TSV 820 is located at the surface 306 of the second side 215 of the substrate 205. A same insulating layer in located within the opening 302 defining the STI structure 810 and within the opening 305 defining the TSV 820. In some embodiments, for example, one or both of a passivation layer 312 or diffusion barrier layer 314, is located on sidewalls 827 of the opening 302 defining the STI structure 810 and on side walls 316 of the opening 305 defining the TSV 820.

As further illustrated in FIG. 8, in some embodiments at least one STI structure 810 is located between the TSV 820 and a passive or active electrical component 420 located on the first side 210 of the substrate 205. As also illustrated in FIG. 8, in some embodiments, at least one STI structure 810 is located between a first passive or active electrical component 420 located on the first side 210 of the substrate 205 and a second passive or active electrical component 425 located on the first side 210 of the substrate 205.

Some embodiments of the IC 200 can further include an electrically conductive layer 430 located on the first side 210 of the substrate 205 and covering the TSV opening 305 on the first side 210. Some embodiments of the IC 200 can include metal lines 440 and interlayer dielectric layers 450 on the first side 210 of the substrate 205. In some cases, at least one of the metal lines 440 electrically connects a passive or active electrical component 420 located on the first side 210 of the substrate 205 to an electrically conductive layer 430 covering the TSV 820.

In some embodiments, a width 330 of the opening 302 of the STI structure 810 is less than a width 320 of the opening 305 of the TSV 820.

The TSV opening 305 traverses the entire thickness 615 of the substrate 205 while the STI opening 302 is buried in the substrate 205. In some embodiments, the TSI opening 302 can traverse a constituent layer 220 present in some embodiments of the substrate 205.

In some embodiments of the IC 200, it is desirable for the width 330 of the STI structure 810 to be as narrow as possible to facilitate electrical isolation of larger numbers of active or passive electrical components 420 on the substrate 205. Having a narrow width 330 facilitates having more area of the substrate 205 available to hold greater numbers of the active or passive electrical components 420 or TSVs 820.

The width 320 of the TSV opening 305 is a careful balance of configuring the TSV 820 to be wide enough to minimize electrical resistance of a current passing through the TSV 820, versus configuring the width 320 too large as to occupy an excessive area of the substrate surface 817. Too high an electrical resistance could detrimentally slow the rate of communicating electrical signals through the TSV 820. If the TSV 820 were to occupy too much area on the substrate 205, this could necessitate, e.g., making a substrate die 205 larger to fit the requisite number of passive or active components needed for a specific application, thereby requiring more resources to manufactured the substrate 205 and thus making the IC 200 larger than desired.

As further illustrated in FIG. 8, in some embodiments, the substrate 205 of the IC 200 is interconnected to one or more other substrates 830 by the TSV 820. In some embodiments, the substrate 205 and the one more other substrates 830 are part of a three-dimensional IC package 840. For instance, in some IC packages 840, the first side 210 of the substrate 205

(e.g., the side 210 having active or passive components 420, 425 thereon) can face the first side 845 of the other substrate 830. In other embodiments, however, the front side 210 of the substrate 205 can face the second opposite side 850 of the other substrate 830. In some embodiments of the IC package 840 could include a stack 860 of multiple substrates 205, 830 that are interconnected to adjacent substrate, or, to non-adjacent substrates of the stack 840 by the TSV 820. For instance, a first substrate could be interconnected to a third substrate through the TSV passing through a second substrate that is located in between the first and third substrate.

FIGS. 1-8 illustrate yet another integrated circuit embodiment of the disclosure. Similar to that discussed above, the example IC 200 depicted in FIG. 8 comprises a substrate 205 having a first side 210 and a second opposite side 215; a STI structure 810, wherein one end 812 of the STI structure is buried inside the substrate 205 and an opposite end 815 of the STI structure 810 is located at a surface 817 of the first side 210 of the substrate 205; and a TSV 820, wherein one end 822 of the TSV 820 is located at the surface 817 of the first side 210 of the substrate 205 and an opposite end 825 of the TSV 820 is located at the surface 306 of the second side 215 of the substrate 205.

For such embodiments of the IC 200, the STI structure 810 and the TSV 820 are formed by a process that includes: forming the STI opening 302 in the first side 210 of the substrate 205 (step 110), forming the partial TSV opening 304 in the first side 210 of the substrate 205 (step 115); extending the partial TSV opening 304 (step 117), wherein the extended partial TSV opening 305 is deeper into the substrate 205 than the STI opening 302; filling the STI opening 302 with a first solid material 307 (step 120); and filling the extended partial TSV 305 with a second solid fill material 310 (step 125.

Neither the STI opening 302, the partial TSV opening 304, nor the extended partial through-substrate via opening 305 penetrate an outer surface 306 of the second side 215 of the substrate 205. At least either: (1) the STI opening 302 and the partial TSV opening 304 are formed simultaneously (step 130), or, (2) the STI opening 302 and the extended partial TSV opening 305 are filled simultaneously (step 135). The IC 200 can further include additional features such as discussed above in the context of FIGS. 1-8.

Those skilled in the art to which this application relates will appreciate that other and further additions, deletions, substitutions and modifications may be made to the described embodiments.

The invention claimed is:
1. An integrated circuit, comprising:
a substrate having a first side and a second opposite side;
a shallow trench isolation structure, wherein one end of the shallow trench isolation structure is buried inside the substrate and an opposite end of the shallow trench isolation structure is located at a surface of the first side of the substrate; and
a through-substrate via, wherein one end of the through-substrate via is located at the surface of the first side of the substrate and an opposite end of the through-substrate via is located at a surface of the second side of the substrate wherein,
a same insulating layer is located within an opening defining the shallow trench isolation structure and within an opening defining the through-substrate via, wherein the same insulating layer includes a passivation layer and a diffusion barrier layer on sidewalls of the opening defining the shallow trench isolation structure and on sidewalls of the opening defining the through-substrate via.

2. The integrated circuit of claim 1, wherein the same insulating layer includes the passivation layer of silicon oxide and the diffusion barrier layer of silicon nitride on the sidewalls of the opening defining the shallow trench isolation structure and on the sidewalls of the opening defining the through-substrate via.

3. The integrated circuit of claim 1, wherein the shallow trench isolation structure is located between the through-substrate via and a passive or active electrical component located on the first side of the substrate.

4. The integrated circuit of claim 1, wherein the shallow trench isolation structure is located between a first passive or active electrical component located on the first side of the substrate and a second passive or active electrical component located on the first side of the substrate.

5. The integrated circuit of claim 1, further including an electrically conductive layer located on the first side of the substrate and covering the through-substrate via opening on the first side.

6. The integrated circuit of claim 1, further including metal lines and interlayer dielectric layers on the first side of the substrate wherein at least one of the metal lines electrically connects a passive or active electrical component located on the first side of the substrate to an electrically conductive layer covering the through-substrate via.

7. The integrated circuit of claim 1, wherein the substrate is interconnected to one or more other substrates by the through-substrate via.

8. The integrated circuit of claim 7, wherein the substrate and the one or more other substrates are part of a three-dimensional integrated circuit package.

9. The integrated circuit of claim 1, wherein the diffusion barrier layer is on the passivation layer on the sidewalls of the opening defining the shallow trench isolation structure and on the sidewalls of the opening defining the through-substrate via.

* * * * *